(12) United States Patent
Johnson et al.

(10) Patent No.: US 7,277,644 B2
(45) Date of Patent: Oct. 2, 2007

(54) FADE-RESISTANT FORWARD ERROR CORRECTION METHOD FOR FREE-SPACE OPTICAL COMMUNICATIONS SYSTEMS

(75) Inventors: Gary W. Johnson, Livermore, CA (US); Farid U. Dowla, Castro Valley, CA (US); Anthony J. Ruggiero, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 633 days.

(21) Appl. No.: 10/676,450

(22) Filed: Sep. 30, 2003

(65) Prior Publication Data

US 2005/0005225 A1 Jan. 6, 2005

Related U.S. Application Data

(60) Provisional application No. 60/478,577, filed on Jun. 13, 2003.

(51) Int. Cl.
*H04B 10/00* (2006.01)
(52) U.S. Cl. .................... 398/158; 398/140; 398/118; 398/119
(58) Field of Classification Search ........ 398/118–131, 398/140, 158–159
See application file for complete search history.

(56) References Cited

U.S. PATENT DOCUMENTS 3,875,534 A * 4/1975 Haven ......................... 398/119
6,278,537 B1 * 8/2001 Miyamori .................... 398/119
6,341,023 B1 * 1/2002 Puc ............................... 398/79
6,556,617 B1 * 4/2003 Tsujimoto .................... 375/141
6,731,878 B1 * 5/2004 Britz et al. .................... 398/96
2003/0002100 A1 * 1/2003 Izadpanah ..................... 359/124

FOREIGN PATENT DOCUMENTS

EP 0989688 A2 3/2000
WO WO 01/06663 A2 1/2001

* cited by examiner

*Primary Examiner*—Agustin Bello
(74) *Attorney, Agent, or Firm*—John P. Wooldridge; John H. Lee

(57) ABSTRACT

Free-space optical (FSO) laser communication systems offer exceptionally wide-bandwidth, secure connections between platforms that cannot other wise be connected via physical means such as optical fiber or cable. However, FSO links are subject to strong channel fading due to atmospheric turbulence and beam pointing errors, limiting practical performance and reliability. We have developed a fade-tolerant architecture based on forward error correcting codes (FECs) combined with delayed, redundant, sub-channels. This redundancy is made feasible though dense wavelength division multiplexing (WDM) and/or high-order M-ary modulation. Experiments and simulations show that error-free communications is feasible even when faced with fades that are tens of milliseconds long. We describe plans for practical implementation of a complete system operating at 2.5 Gbps.

8 Claims, 8 Drawing Sheets

FADE-RESISTANT FORWARD ERROR CORRECTION METHOD FOR FREE-SPACE OPTICAL COMMUNICATIONS SYSTEMS

This applications claims priority to U.S. Provisional Patent Application Ser. No. 60/478,577, titled "Fade-Resistant Forward Error Correction Method for Free-Space Optical Communications Systems" filed Jun. 13, 2003, incorporated herein by reference.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to free-space optical laser communication, and more specifically, it relates to techniques for increasing the practical performance and reliability of free-space optical laser communication by resisting channel fading due to atmospheric turbulence and beam pointing errors.

2. Description of Related Art

Free-space optical (FSO) laser communication is becoming an important technology because it allows for a smaller, lighter and more cost-effective communication system at very high data transmission rates. However, one drawback in FSO communication is the strong fading that occurs due to atmospheric scintillation and beam wander. Fading reduces the receiver's signal-to-noise ratio, resulting in data errors. When deployed on a mobile platform such as an aircraft, FSO systems may also suffer from beam pointing errors that temporarily reduce the received power. Transient obstructions may also occur, such as passing birds or clouds. Data collected by the present inventors on 1.3 and 28 km horizontal terrestrial links indicate frequent fades on the order of 10 ms in length. In the presence of such fades, an otherwise excellent communication link can rapidly degrade in terms of the system being a reliable or stable system.

There are many possible optical techniques that may be employed to reduce the effects of fading, and in fact the skilled FSO link designer will combine all of these known techniques in varying degrees:

1. Increase transmitter power. This is not always practical because of eye safety limits, or limitations in the state-of-the-art in transmitter power output capability.

2. Improve the photoreceiver dynamic range, particularly the performance at low input power. Laws of physics dictate that a certain number of photons per bit of information must be received, and some existing photoreceivers are already very near this limit Thus, there will always be fades severe enough to cause errors.

3. Increase the size of the receiver aperture to collect more energy and to improve the average received power through aperture averaging of the scintillated beam. This is not always feasible due to practical matters of physical size and cost 4. Add spatial diversity to the transmitter. Sending multiple optical beams along nominally parallel paths creates spatial de-correlation that tends to average out the effects of scintillation. However, this adds complexity to the transmitter optics, causes great difficulty in time alignment of the beams, and typically requires impractically-large spacing between the beams.

5. Reduce the coherence of the transmitted beam, i.e., use a broadband light source as opposed to a monochromatic laser, to reduce scintillation. Such light sources cannot be focused as effectively, leading to lower average received power.

In addition to these optical techniques, there are also several known techniques involving signal processing, error correction, and network protocols:

1. Retransmit defective data, typically at the packet level. Drawbacks of this method include the requirement for a reverse channel (receiver to transmitter) to request retransmission, added latency, and reduced overall transfer rate because entire packets (consisting of a large number of bits) of data must be retransmitted.

2. Apply forward error correction (FEC) codes that use convolution and interleaving over a block of data [Ref. 1]. This method fails when the fade length exceeds the correction power of the code. It is tempting to propose increasing the convolution length, but that is computationally impractical with very high data speeds (several Gbps) in the face of long fades (10 ms) where hundreds of megabits must be evaluated in each FEC frame. This approach still provides some utility, however, in correcting shorter fades or burst errors.

3. Apply FECs that are coded over multiple wavelengths [Ref. 2]. This method was devised to address the more conventional wideband noise and distortion problems in fiber-optic links and has the same drawbacks as the previous FEC method.

An effective method for addressing long fades is to use delay diversity. [Ref. 3] Multiple copies of each bit or packet of data is transmitted with a suitable delay inserted between each copy. The copies can be transmitted serially on a single wavelength or channel, but this results in a maximum throughput equal to the channel capacity divided by the number of redundant copies. The copies can also be transmitted on different wavelengths or channels [Ref. 4]. Received data on each channel is then temporally adjusted and combined into a single output. That method, as described in the prior art, is fundamentally sound but requires significant improvements in order to become a practical and useful system for FSO link fade mitigation.

SUMMARY OF THE INVENTION

It is an object of the present invention to provide a system and method for FSO communication with fading resistance, high spectral efficiency, and protocol independence.

These and other objects will be apparent based on the disclosure herein.

Free-space optical (FSO) laser communication systems offer exceptionally wide-bandwidth, secure connections between platforms that cannot otherwise be connected via physical means such as optical fiber or cable. However, FSO links are subject to strong channel fading due to atmospheric turbulence and beam pointing errors, limiting practical performance and reliability. The present invention provides a system and method for FSO communication with fading resistance, high spectral efficiency, and protocol independence. A delayed diversity approach is taken, based on ultra-dense wavelength division multiplexing (UDWDM) and/or M-ary optical modulation to improve spectral efficiency. It is further shown that the number of redundant channels can be made variable, thus dynamically optimizing spectrum usage based on average link quality. Forward error correcting (FEC) codes are employed as a bad block detector, thus providing an effective means of identifying and selecting the valid channel from among the available channels. Protocol independence is maintained throughout the system, making it usable in all data communication scenarios. The system is shown to be scalable to very high data rates. Experiments and simulations show that error-free communication is feasible even when faced with fades that are tens of milliseconds long.

DETAILED DESCRIPTION OF THE INVENTION

The present invention provides a system and method for FSO communication with fading resistance, high spectral efficiency, and protocol independence. A delayed diversity approach is taken, based on ultra-dense wavelength division multiplexing (UDWDM) and/or M-ary optical modulation to improve spectral efficiency. (Dense wavelength division multiplexing uses channel spacings of about 50 GHz. UDWDM uses channel spacings of about 10 GHz.) It is shown below that the number of redundant channels can be made variable, thus dynamically optimizing spectrum usage based on average link quality. Forward error correcting (FEC) codes are employed as a bad block detector, thus providing an effective means of identifying the block from the valid channel among the available channels. FEC codes are also used as a means for correcting data errors. Protocol independence is maintained throughout the system, making it usable in all data communication scenarios. The system is shown to be scalable to very high data rates.

The present invention includes a method for reliably recombining the delayed channels at the receiver. A shortcoming of the prior art regarding delay diversity [Ref. 4] is that the only method described therein for recombining the received channels is through a logical OR function with on-off keyed (OOK) data. While this may make some intuitive sense, it is in fact unworkable. Such prior art assumes that when a fade occurs, the photoreceiver produces a logical zero. In reality, all realizable photoreceivers produce a random data output during a fade. The OR function then produces a similar random data output, resulting in a corrupted system output Alternative solutions are hinted at in a generic sense but none are identified.

Figure 1:
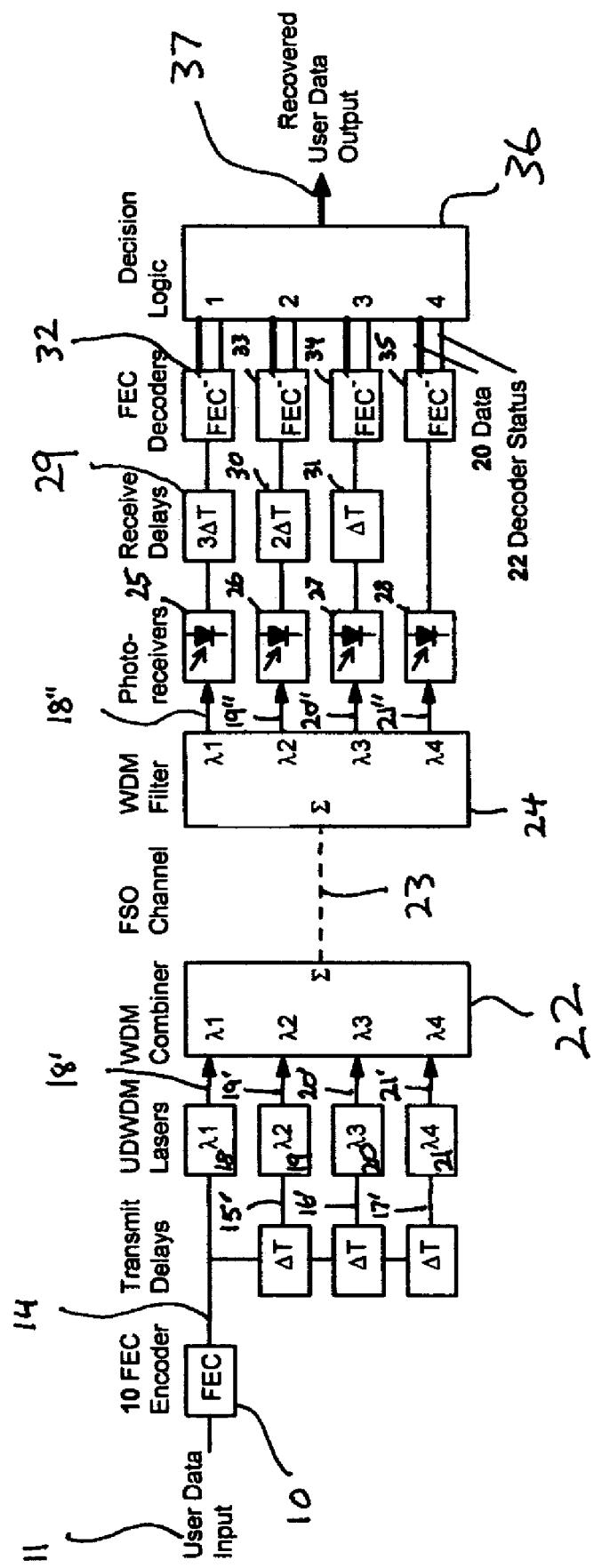
FIG. 1 shows a UDWDM delay diversity communications system with FEC error detection.

In the present invention, all of the diverse channels have an added forward error correction code applied to each block of data. Referring to FIG. 1, FEC encoder 10 adds the encoding overhead to the input data 11. The length of the data block and the particular type of FEC can be chosen by the system designer based on tradeoffs between coding gain, coding overhead, and hardware complexity. In one embodiment, a conventional (255,238) Reed-Solomon FEC is chosen. The decoding algorithm for Reed-Solomon provides a status flag showing the success of the decoding process. If the data is sufficiently corrupt, as in the case of a severe fade, the code will fail to completely correct the data and will report this failure status. This information, in the form of a digital logic bit 22 provided by each of the delayed channel FEC decoders 12, is passed to the output channel selector 24. The selector can then evaluate each channel on the basis of decoding success or failure, and the first successful channel data 20, will be passed along to the final system output 26.

A feature of the FEC system is that the decoding failure status information can be analyzed statistically in real time to directly measure FSO link quality and bit-error-rate of the recovered data.

An obvious advantage of using FEC codes is the effective improvement in signal to noise ratio, also known as the coding gain. Using a sophisticated FEC code, such as a turbo product code, can drastically reduce the number of single-bit errors due to conventional wideband noise as well as some short burst errors.

In the embodiment illustrated generally in FIG. 1, the FEC encoded user data 14 is split from the original into a at least one, and preferably a plurality of copies by delay means 15, 16, 17 into delayed copies 15', 16', 17' respectively, where each copy is delayed in time relative to the original and the other copies. Preferably, the delays will be equal and in series. The delays can be created in a variety of ways, e.g., electronically, physically, e.g., by transmitting each packet of user data through a length of cable or optically, e.g., by placing an optical delay between the UDWDM laser and the multiplexor. The original and the delayed channels are transmitted over several closely-spaced wavelengths within the ultradense wavelength division multiplexing (UDWDM) regime by UDWDM lasers 18, 19, 20, 21 to produce respective beams 18', 19', 20', 21'. This contrasts with prior art [Christopher] where the chosen wavelengths were in widely-separated optical bands such as visible, near-infrared, and far-infrared. Using such diverse wavelengths results in exceptionally difficult optical system design and is also subject to the limited availability of suitable optical components, such as modulators, outside of the bands commonly used in commercial lightwave communications. By choosing UDWDM, for instance 10 GHz channel spacing in the 1550 nm infrared band, hundreds of channels can be practically implemented with commercial components. The beams from UDWDM lasers 18, 19, 20, 21 are combined, e.g., in a WDM multiplexor 22 as is known in the art The UDWDM lasers may be configured to operate in an on-off keyed mode or a non-return to zero mode. Other optical beam combining configurations could be used alternately. The combined beam 23 is transmitted over the desired FSO channel and received, e.g., by WDM demultiplexor 24. The demultiplexed beams 18", 19", 20", 21" are each detected by respective photoreceivers 25, 26, 27, 28, realigned temporally in respective receive delays 29, 30, 31, decoded by respective FEC decoders 32, 33, 34, 35 before passing into decision logic means 36 which outputs recovered user data 37. Note that the receive delays 29, 30, 31 may be alternately located, e.g., after the FEC decoders.

In another embodiment (FIG. 2), the delayed channels are transmitted over a single wavelength by employing higher-order optical modulation such as M-ary phase shift keying (PSK). In prior art [Christopher], a single wavelength is proposed with two delayed channels carried simultaneously though polarization multiplexing. However, this limits the utilization to two channels per wavelength. It also requires the optical system to be designed with polarization-maintaining components, which can add complexity. In other prior art [Ref. 5], M-ary keying is proposed for its increased spectral efficiency but does not address the problems associated with long fades. In the present invention, M delayed channels are mapped into $2^M$ phase-shifted states of the optical carrier. Thus, the advantages of delay diversity are combined with the enhanced spectral efficiency of M-ary keying.

Figure 2:
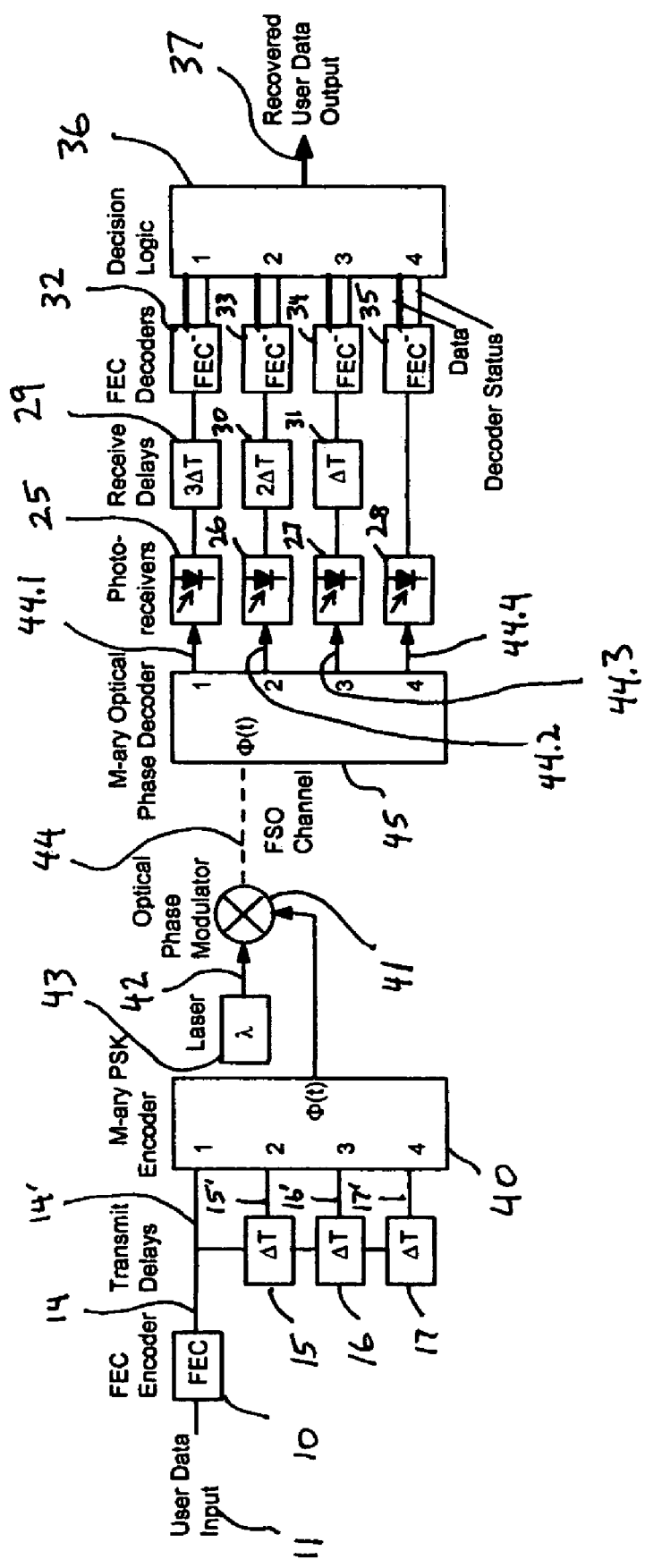
FIG. 2 shows an optical M-ary delay diversity communications system with FEC error detection.

In FIG. 2, delayed data flows into a digital logic circuit configured as an M-ary PSK encoder 40. Elements shown in FIG. 2 that are similar or identical to elements of FIG. 1 are given the same reference numbers. The output of encoder 40 drives an optical phase modulator 41 which phase modulates light 42 provided by laser 43. Modulated light 44 is transmitted over the FSO link and received by an optical M-ary phase decoder 45. Such decoders are typically based on Mach-Zehnder interferometers. The separated optical output channels 44.1, 44.2, 44.3, 44.4 of decoder 45 drive a set of photoreceivers that turn the optical signals into electrical OOK signals. The remainder of the system is similar to that of FIG. 1.

A further advantage of PSK is that the information is conveyed in the phase of the optical carrier rather than the amplitude. In the presence of amplitude noise, which is the very nature of atmospheric scintillation as well as conventional electrical and optical noise sources, PSK offers improved noise rejection [Ref. 6].

Other high-order modulation formats are also usable in this system. Examples include all the known combinations of amplitude, frequency, and phase modulation.

Figure 3:
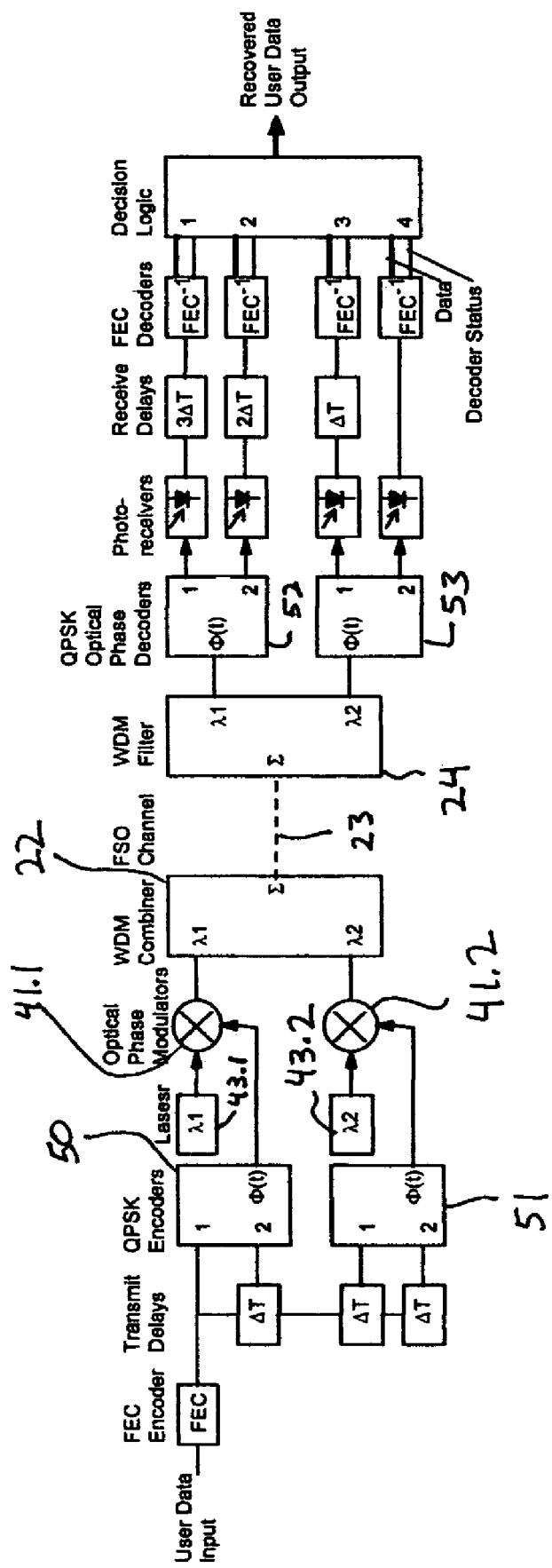
FIG. 3 shows a hybrid UDWDM and optical M-ary delay diversity communications system with FEC error detection.

In another embodiment (FIG. 3), with like elements as numbered previously, the delayed channels are transmitted over several UDWDM wavelengths, with each wavelength modulated by M-ary keying. This permits a compromise where M is a lower value, such as 2, which might be necessary to enable operation with an optical channel where the signal-to-noise ratio is insufficient to support higher-order modulation. Lower-order modulation is also simpler and cheaper to implement In the figure, QPSK encoder 50 provides a set of signals corresponding to the original packet of FEC encoded user data 14' and the first copy 15' that drive optical phase modulator 41.1, which modulates a beam from laser 43.1 that is send to WDM multiplexor 22. Similarly, QPSK encoder 51 provides a set of signals corresponding to FEC encoded user data 16' and 17' that drive optical phase modulator 41.2, which modulates a beam from laser 43.2 that is send to WDM multiplexor 22. The beams are combined in WDM multiplexor 22, transmitted across FSO channel 23, recombined in WDM demultiplexor 24 and decoded in QPSK decoders 52, 53. The remainder of the system is similar to that of FIGS. 1 and 2.

Figure 4:
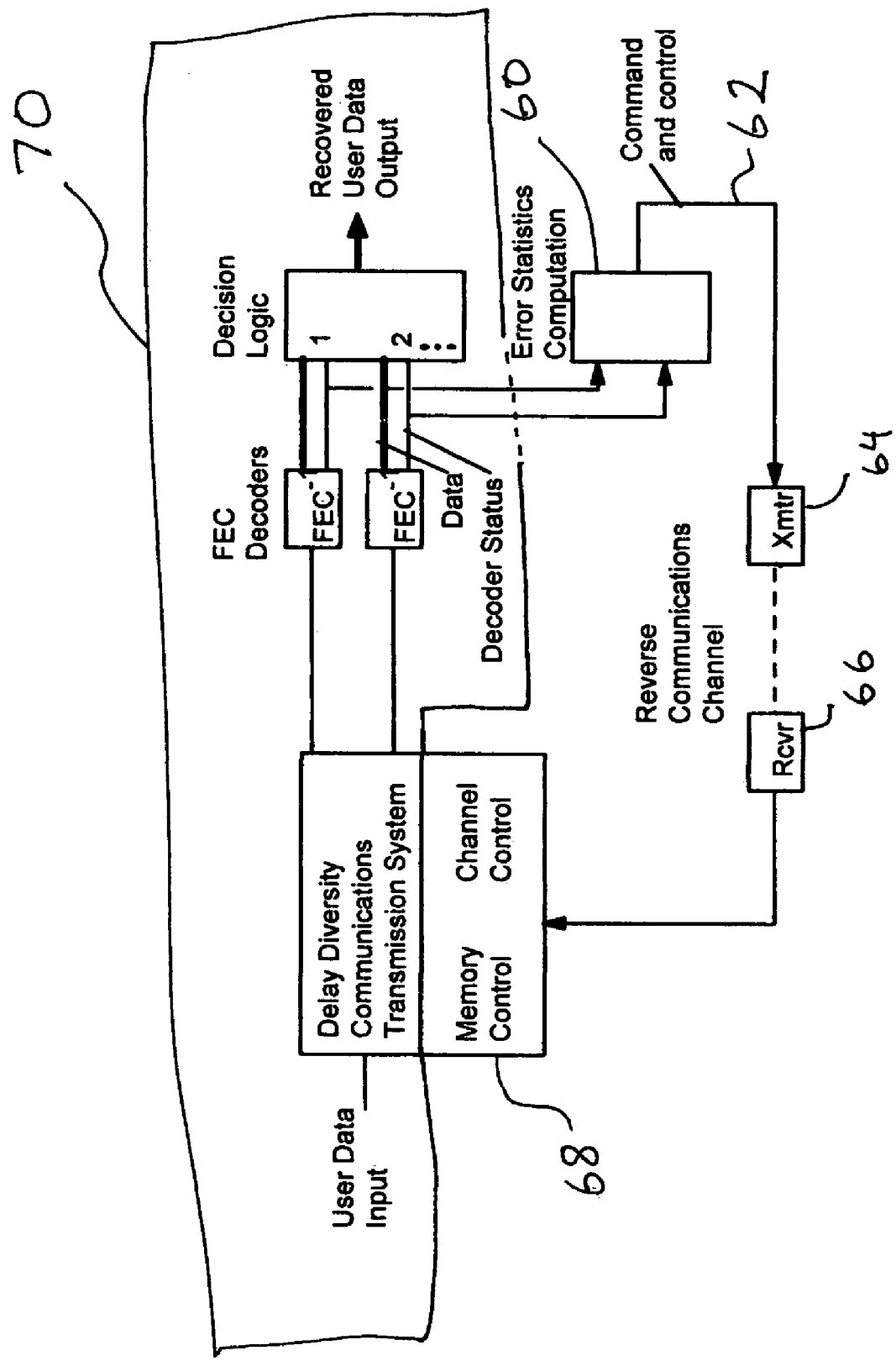
FIG. 4 shows a delay diversity communications system with adaptive delays and channel count.
Figure 5:
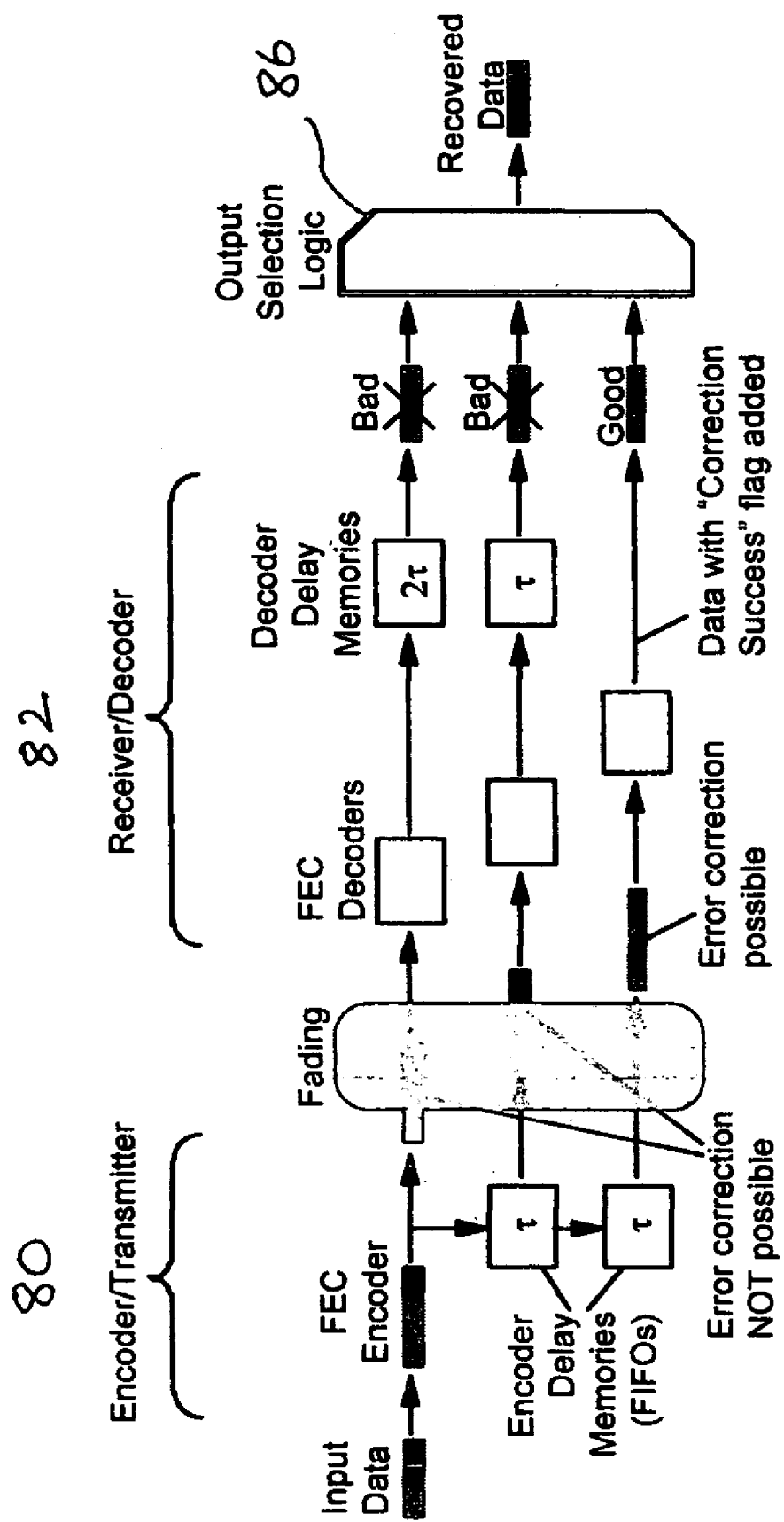
FIG. 5 is a fundamental overview of the FEC system
Figure 6:
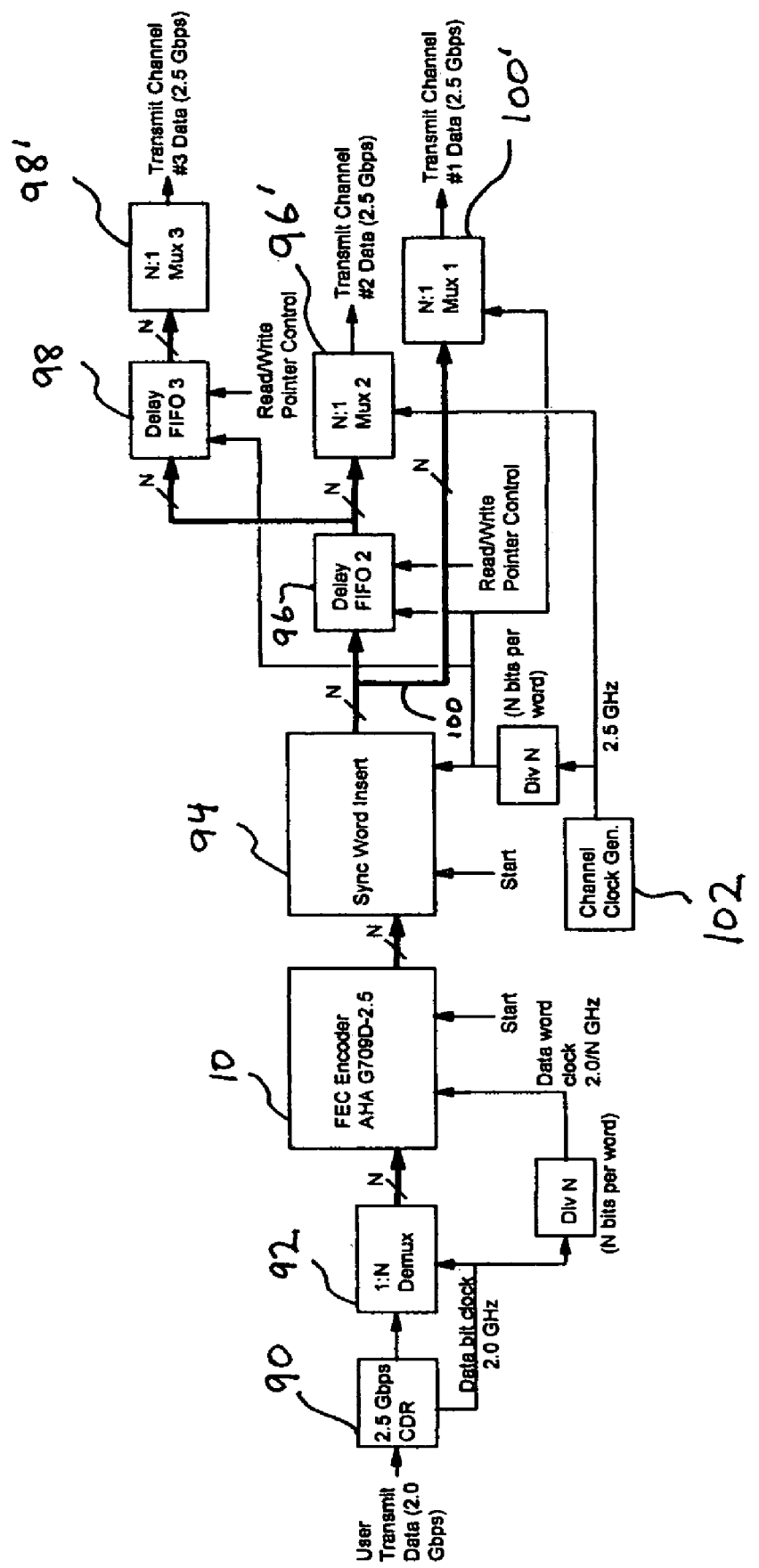
FIG. 6 is a transmitter/encoder block diagram.
Figure 7:
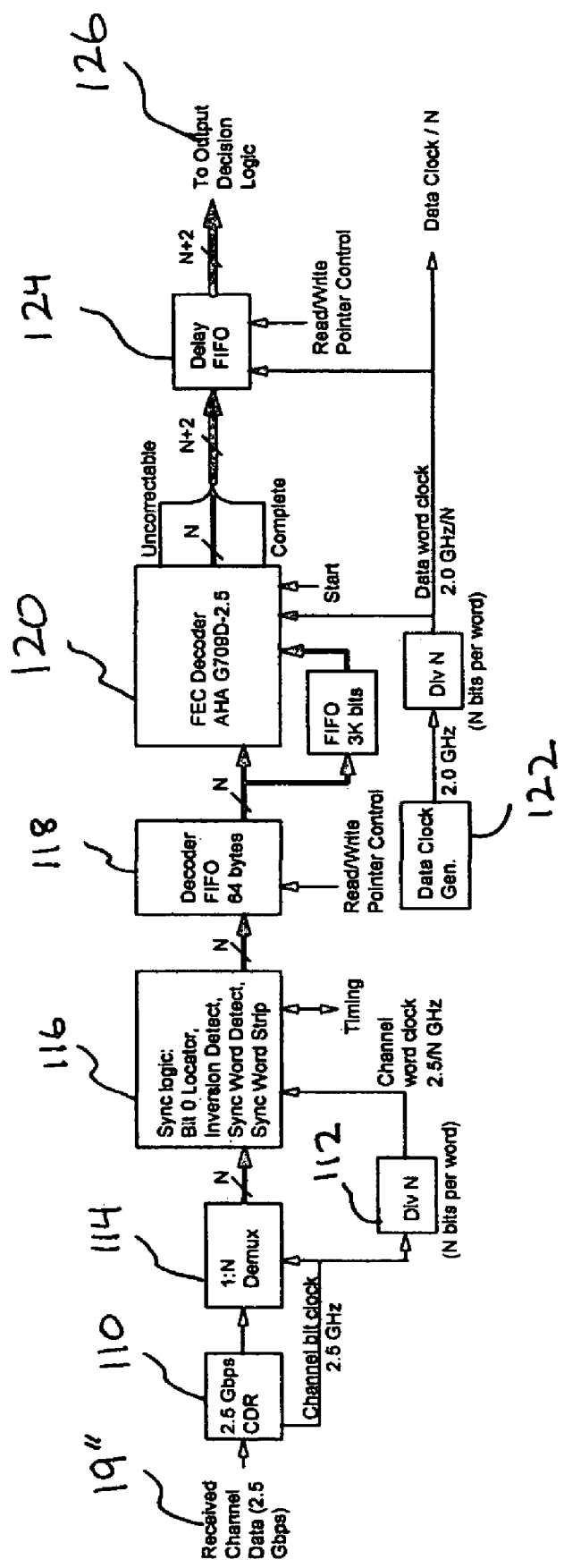
FIG. 7 is a receiver/decoder block diagram.
Figure 8:
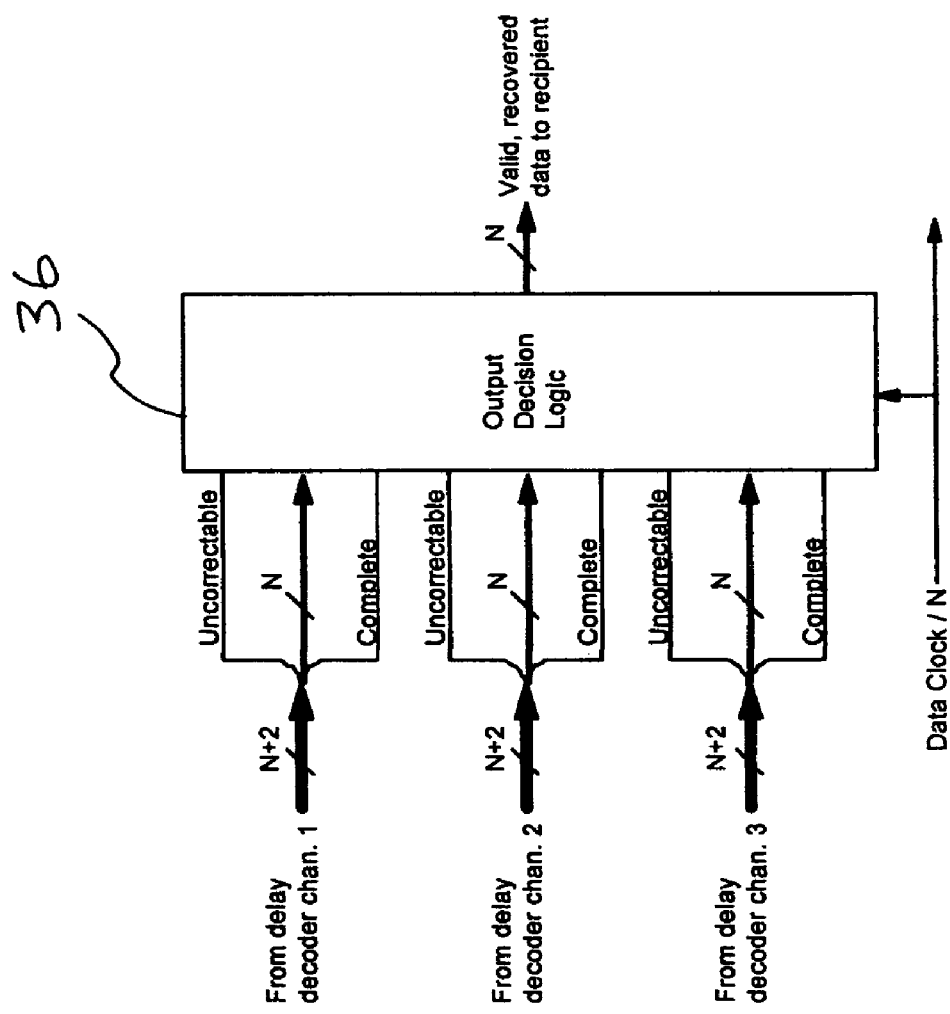
FIG. 8 is an output decision logic block diagram.

FIG. 4 is exemplary of an embodiment where the number of redundant channels and the inter-channel delay times can be varied dynamically to accommodate changes in FSO link quality. For instance, if the observed fading decreases in frequency or length, the number of redundant channels can be reduced, thus allowing a larger total number of data channels to occupy the available optical spectrum. Delay times can be dynamically tuned to optimize the performance of the system in response to observed fade statistics. Changing delay time is easily accomplished by manipulating memory address pointers. Changing the number of channels involves turning specific lasers on or off. A reverse communications channel is required to transmit the desired channel count and delay setting from the receiver back to the transmitter. This reverse channel need not have high bandwidth and could be implemented as either an optical or radio link In the figure, an error statistics computation module 60 reads the decoder status from the FEC decoders of the previous embodiments and send a command and control signal 62 to a transmitter 64 and receiver 66, which adjusts the delay diversity communications transmission system through a memory control/channel control module 68. Block 70 is similar to the previously described embodiments, which did not include the module 68.

Another feature of the system presented in this invention is that it is protocol-independent. Input data is treated as a simple serial bit stream with no special requirements on data format or coding. The recovered output data is a bit-by-bit copy of the original input.

[1] Davidson, Frederic M., and Koh, Yutai T., "Interleaved Convolutional Coding for the Turbulent Atmospheric Optical Communication Channel." IEEE Trans. On Communications, Vol. 36. No. 9, September 1988, pp. 993-1003.

[2] Shou-Kuo Shao and Ming-Seng Kao, "WDM Coding for High-Capacity Lightwave Systems," Journal of Lightwave Technology, Vol. 12, No. 1, January 1994, pp. 137-148.

[3] Davis, Christopher C. and Smolyaninov, Igor I., "The Effect of Atmospheric Turbulence on Bit-Error-Rate in an On-Off-Keyed Optical Wireless System." Free-Space Laser Communication and Laser Imaging, Proc. Of SPIE, Vol. 4489, 2002, pp. 126-137.

[4] Christopher Davis, International Patent No. WO 01/06663 A2, January 2001.

[5] Ungerboeck, Gottfried, "Channel Coding with multilevel/phase signals." IEEE Trans. Information Theory, Vol. IT-28, January 1982, pp55-67.

[6] H. Nishizawa, Y. Yamada, Y. Shibata, and K. Habara, "10-Gb/s Optical DPSK Packet Receiver Proof Against Large Power Fluctuations," IEEE Photonics Technology Let, Vol. 11, No. 6, June, 1999 pp. 733-735.

The above 6 references are incorporated herein by reference.

The following discussion provides implementation details for an embodiment of a fade-tolerant forward error correction (FEC) system for use in ultra-dense wavelength division multiplexed (UDWDM) free-space optical (FSO) communication links. Information is presented at the block diagram level with discussions of design options and tradeoffs.

A fundamental overview of the delay diversity FEC system appears in Figure. It consists of a transmitter/encoder (left side of the diagram) 80, a receiver/decoder 82, and output selection logic 86. An incoming user data stream passes through a conventional FEC encoding process that adds parity bits. Copies of the encoded data are delayed by several milliseconds per copy and then transmitted as a set of redundant channels. After passing through the transmission medium, received data is decoded and passed through complementary delays. During decoding, an extra flag is added to each block of data indicating whether each particular block was successfully decoded. Data from each redundant channel then reaches the output selection logic where the "success" bit is evaluated. The first valid channel is then routed to the final destination. Although not shown in the figure, note that error correction is possible in some cases where fading has corrupted a portion of the packet of data. The amount of data that can be corrected depend on the power of the particular FEC decoder.

A block diagram of the transmitter/encoder section is shown in Figure. This illustrates the generation of the first 3 channels of FEC encoded data of the previous embodiments, and like reference numbers are employed. Data 11 from the user's data source enters the transmitter/encoder as a serial stream. This is referred to herein as the data path. The output of the transmitter is another serial stream running at a faster rate to accommodate added FEC and sync bits. This is referred to herein as the channel path. Exact speeds for the two streams must be calculated in advance and very stable clocks must be used to avoid buffer overrun problems. In general, the channel should run slightly faster (e.g., 1%) than calculated. This keeps the transmit buffer empty and has a low risk of overflowing the receiver buffer.

User data enters a clock/data recovery (CDR) chip 90 that retimes the data and regenerates the data clock. The recovered data clock is divided by N in module 92, where N is the transmitter's parallel data path width in bits. Data is demultiplexed 1:N and passed as a stream of parallel words to the FEC encoder 10. Demultiplexing is commonly referred to as deserialization, and specialized chips are available to perform this function.

The FEC encoder adds parity words and may perform interleaving of the data to improve burst error performance. It is important that this encoder and its complementary decoder be highly deterministic in terms of propagation delay. Iterative codes such as Turbo Product Codes can be problematic if the iteration count is variable. Since the delay coding scheme is so highly dependent upon relative inter-channel timing, it is obvious why these processing delays must be managed. A parallel logic design is required to manage the data rate. An example of a suitable FEC encoder available as a VHDL core is the Advanced Hardware Architectures G709D-2.5, which uses a (255,237) Reed-Solomon code and has I/O timing features suitable for this design. A start command is given to the FEC encoder by the timing and control logic, which keeps track of the number of bytes in each encoded buffer.

After encoding, data streams out of the encoder at the higher channel rate and into a sync word inserter 94. The sync word is a defined bit pattern that appears at the start of each encoded buffer of data. It is used by the receiver to locate start-of-data. A start, or insert, command is given to the sync inserter by the timing and control logic.

Data from the sync inserter then passes to the delay FIFO cascade, which comprises Delay FIFO 2 (96) and Delay FIFO 3 (98). (A non-delayed channel 100 is also provided.) This large memory produces the required time delay for each of the redundant data channels. Delay time is the channel rate divided by the number of bits stored in the FIFO. For instance, a 2.5 Gbps channel rate requires 2.5 Mbits of FIFO storage per millisecond of delay. Fast, high-capacity FIFO chips are required and may be cascaded to expand the total storage. FIFO width is driven by maximum clock speed: FIFO width equals channel rate divided by FIFO speed. For instance, 2.5 Gbps data in a 16-bit data path requires a 156 MHz memory clock (102). Example devices are the IDT TeraSync series with capacities up to 9 Mbit per chip, speeds to 225 MHz, and various widths from 9 to 72 bits.

Timing and control logic manipulates the read/write pointers and clocks to the FIFOs. A typical initialization procedure begins with the memory reset and both the read and write pointers set to zero. Data is written to memory, with only the write clock active, until the desired number of words are stored. Then the clocks are both enabled, thus keeping them locked together but with the desired phase delay.

Parallel data is clocked out of each delay FIFO into a serializer, which is typically implemented as a fast shift register. The serial output runs at the channel speed and is routed to the optical transmitter.

Delay FIFOs, each with their associated serializer (96' and 98'), can be cascaded to create any number of delayed redundant channels. For the non-delayed channel, data 100 from the sync inserter is passed directly to the output serializer 100'. Alternatively, the entire encoding system could be duplicated for each channel, though that would probably result in an overall increase in complexity and cost.

A timing and control subsystem is also required. Content of that subsystem is highly dependent on implementation, and it may be diffused throughout the design. Main functions are initialization, management of FIFO pointers, and synchronization of data flow between functional blocks.

FIGURE is a block diagram of the receiver/decoder section of a single channel of the previously described embodiments; however, the receive delay is implemented after the FEC Decoder. Received channel data, e.g., 19", in serial format, enters a clock/data recovery (CDR) chip 110 that retimes the data and regenerates the channel clock. The recovered channel clock is divided by N (112), where N is the receiver's parallel data path width in bits. Data is demultiplexed 1:N (114) and passed as a stream of parallel words to the sync logic 116.

Since FECs operate on blocks of data, the incoming channel data contains a sync word to flag start-of-block. Sync logic performs this function, and more. The sync word is detected by a simple pattern matching process. Because there may be errors in the raw data, it may be useful to add a tolerance of a few bits to the matching rule. It is also a good idea to search for the inverted version of the sync word as well, because some communications systems may have a logic inversion. If the sync word is found to be inverted, all data must be inverted as well. Once the sync word is located, it is discarded, and the (optionally-inverted) data is passed to the decoder FIFO 118. A critical timing output from the sync logic is a flag to indicate start-of-block.

Depending upon the timing and design specifics of the overall decoding system, a small decoder FIFO 120 may be required after sync detection.

A clock generator 122 provides a stable clock at the user data rate divided by N, where N is the receiver's parallel data path width in bits. This clock is distributed to the FEC decoder and delay FIFO 124, the output decision logic 126, and the system timing logic.

The FEC decoder performs de-interleaving, removal of parity bits, and correction of errors. Its algorithm must be an exact complement to that used by the FEC encoder. In the design given by the AHA model G709D-2.5, some dedicated FIFO memory is also required. Decoding begins when the required amount of data has been loaded into memory. An appropriate start signal is generated by the system timing logic to trigger decoding when memory is full. When decoding is finished, the decoder generates a complete bit to signal downstream consumers that the first word of a block of data is exiting the decoder. The decoder must also generate an uncorrectable bit if the decoding process has failed to fully correct all errors. This bit is set at the same time as the complete bit. Both status bits are combined with the decoded data into a larger parallel word that is passed to the delay FIFO.

After decoding, parallel data with the uncorrectable and complete bits is sent to the delay FIFO. A different delay is required for each of the redundant data channels, and those delays must be equal to the delays chosen for the encoder/transmitter channels. Similar memory technology and design would be used here.

Data and status bits from each of the redundant channel decoders is routed to the Output Decision Logic 36, shown in FIGURE. This subsystem decides which (if any) of the available channels is carrying a valid message, and routes that data to the output which is ultimately connected to the user's device. A simple sequence of events occurs for each data block. First, the complete bit is detected on each channel, indicating the start of a new packet. Simultaneously, any channel may assert the uncorrectable bit, indicating that the following block of data is defective. The first channel with a valid block should be gated to the output. Words of data are clocked through continuously by the Data Clock/N clock. Implementation of this subsystem is probably in an ASIC or FPGA, subject to speed limits and data path widths that we have already discussed.

If all channels indicate defective data, the system designer has several options. You could take no special action and simply route one channel to the output, with the assumption that the destination device will be able to handle a defective message, perhaps by requesting retransmission. Or, the output logic can generate a failure flag to explicitly notify the destination device. The output data could also be set to a pre-defined pattern instead of simply passing along defective data.

A timing analysis of the entire system is required to determine how much inter-channel jitter may be expected. If all channels are guaranteed to be within a fraction of a clock cycle at all times, the decision logic design problem is very simple. Otherwise, additional buffering and synchronization tricks are required to realign the channels. For instance, each data block could include a sequential serial number, much like IP protocol. With suitable buffering, the decision logic can locate and match serial numbers for sets of data blocks.

Some sources of deterministic or constant time delay are:

1. Communications channel interface hardware. For instance, lengths of cables and fibers and propagation time though various electro-optical components are all constant values (except for some temperature drift). It is clear that the delays in these components can easily add up to several nanoseconds, which is an indicator for incorporating de-skewing hardware.

2. Data processing logic. With a competent design, there should be little or no variation in propagation time through the encoder or decoder sides of the system. This is also why an FEC algorithm with fixed delay was chosen.

Some sources of jitter and uncontrollable time delay are:

1. Clock-data recovery. Recovering a noisy signal and retiming it to picosecond tolerances always results in some jitter.

2. Loss of sync in the receiver deserializer. This results in a bit rotation in the parallel output of the device, which may appear as at least a temporary n-bit delay.

3. Receiver channel response during loss of signal. CDRs are based on phase-locked loops that may rapidly drift and then take some microseconds to re-acquire lock. Thus, the channel clock may suffer a transient change in frequency.

Only the basic architectural design concepts are presented here. There are many implementation-dependent choices that affect design details for a delay-diversity system. A thorough understanding of the particular application is required before embarking on a design, including:

1. Data speed(s);
2. Data protocol(s);
3. Optical link speed limitations;
4. Optical link modulation method;
5. Expected severity of link fades;
6. Need for flexibility or adaptability, such as channel count or speed; and
7. Power, volume, and cost requirements.

These considerations will be understood by those skilled in the art.

The upper speed limit is defined only by the state of the art in semiconductors, cost, and willingness to create a complex high-speed digital design. With a reasonable parallel data path width such as 16 bits, 200 MHz ASICs, and current FIFO memory capacity (9 Mbit chips), it is reasonable to build a system that operates around 2.5 Gbps with 10 ms delay. The system can be designed with programmable rates, allowing it to synchronize to virtually any data source.

No protocol dependence of any kind is assumed herein. There may be reasons to design the data input/output portion of the system in such a way that it is aware of a particular protocol. For instance, it could operate on IP packets as the basic block of data to which FECs are applied.

Added deadtime due to the FIFO delays can certainly have an impact on protocol performance if handshaking (acknowledgement) packets are required. Running TCP/IP with a full-duplex link and 10 ms of delay in each direction will result in a packet rate of no more than 50 packets/sec at startup, accelerating as the number of forward packets per ACK is increased. Other protocols such as UDP do not require ACKs and thus are immune to this problem, but leave the designer with packet sequencing issues.

Simulations and analysis of data acquired on real FSO links will provide an optimal number of redundant channels to implement Simple tests indicate that three or four channels are almost always sufficient, and using more than four probably will offer negligible improvements. Therefore, a design based on four channels is recommended at this time. Note that one or more channels can be freely disconnect without altering the hardware in any way. Thus, a two- or three-channel configuration is automatically available with a four-channel implementation.

It is also possible to design in a dynamically-flexible channel count. The objective is to increase the maximum link throughput by minimizing the number of channels required to obtain the desired error performance. Since the output decision logic supplies a measure of the number of bad blocks received, a real-time statistical technique could be devised to minimize the channel count. Information would have to be sent via a back-channel to the transmitter, telling it which channels to activate for what purpose.

To overcome a maximum channel fade duration of 10 ms, the total FIFO delay on the transmitter needs to be at least 10 ms. This is the current working value based on the present inventors' link data and should be used in initial design efforts. Experience with different kinds of links (e.g., airborne) will lead to different recommendations. It would be wise to build flexibility into the design. For instance, FIFO pointers could be user-programmable to permit adjustable delays. The tradeoffs here are the number of FIFO chips required, versus the robustness of the system with regards to fade duration, versus the added deadtime of long delays.

User data can enter and exit the system via serial or parallel interfaces. Herein is shown serial data into the encoder and parallel data out of the decoder. There will be no impact on system performance, regardless of choice.

In the simplest implementation, each of the redundant channels is assigned to its own optical wavelength. This takes advantage of the abundance of optical bandwidth and the reasonable cost of WDM channels. Fundamental to the present work is the ability to use complex modulation (e.g., quadrature phase shift keying (QPSK)) as a means of encoding more than one of the redundant channels onto a single optical wavelength. This increases the total theoretical capacity of an optical link by increasing bandwidth utilization. It reduces the number of optical transmitters and receivers, but may require additional components (optical, microwave, or digital) to handle the complex modulation. While Non Return to Zero (NRZ) modulation is simple, it does not permit multiplexing and has poor amplitude noise rejection. Therefore, it is likely that a PSK scheme is a worthwhile investment in any case.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A fade-resistant forward error correction (FEC) method for a free-space optical communications system, comprising:
   encoding user input data with a forward error correction (FEC) code to produce encoded user data;
   producing a plurality of encoded user data channels from said encoded user data, wherein each particular channel of said encoded user data channels comprises a unique delay relative to all of the other channels of said plurality of encoded user data channels;
   a step for transmitting said plurality of encoded user data channels across a free space optical channel to produce transmitted channels;
   a step for receiving said transmitted channels and separating each channel from said transmitted channels to produce a plurality of received channels;
   detecting each channel of said plurality of received channels;
   adjusting selected ones of said received channels so all of them are temporally equal;
   decoding said received channels to produce decoded channels; and
   sending the first successfully decoded received channel of said decoded channels as a recovered user data output, wherein said step for transmitting said plurality of encoded user data channels across a free space optical channel comprises:
   in a first quadrature phase shift keying (QPSK) encoder, QPSK encoding a first group of at least two channels of said encoded user data channels and combining said first group in said first QPSK encoder into a first QPSK transmission channel;
   driving a first optical phase modulator (OPM) with said first QPSK transmission channel;
   modulating a first laser beam produced by a first UDWDM laser with said first OPM to produce a first OPM channel;
   in a second quadrature phase shift keying (QPSK) encoder, QPSK encoding a second group of at least two channels of said encoded user data channels and combining said second group in said second QPSK encoder into a second QPSK transmission channel;
   driving a second optical phase modulator (OPM) with said second QPSK transmission channel;
   modulating a second laser beam produced by a second UDWDM laser with said second OPM to produce a second OPM channel;
   combining said first OPM channel and said second OPM channel in a wavelength division multiplexing multiplexor (WDM-MUX) to produce combined channels; and
   transmitting said combined channels across said free-space optical channel to produce said transmitted channels;
   wherein said step for receiving said plurality of encoded user data channels and separating each channel from said plurality of encoded user data channels comprises:
   demultiplexing said plurality of encoded user data channels of said combined channels in a wavelength division multiplexing de-multiplexor to reconstruct said first OPM channel and said second OPM channel to produce a reconstructed first OPM channel and a reconstructed second OPM channel;
   in a first QPSK optical phase decoder, decoding said first reconstructed OPM channel to produce a first group of light beams corresponding to said first group; and
   in a second QPSK optical phase decoder, decoding said second reconstructed OPM channel to produce a second group of light beams corresponding to said second group, wherein said first group of light beams and said second group of light beams are referred to as a plurality of received beams.

2. The method of claim 1, wherein the step for transmitting said plurality of encoded user data channels across a free space optical channel comprises modulating said plurality of encoded user data channels with a modulation scheme selected from the group consisting of amplitude modulation, frequency modulation and phase modulation.

3. The method of claim 1, wherein said FEC code includes a forward error correcting code that selects viable received channels from a set of diversity delayed channels.

4. The method of claim 1, wherein said step for transmitting said plurality of encoded user data channels across a free space optical channel includes modulating said plurality of encoded user data channels with high-order modulation.

5. The method of claim 1, wherein said step for transmitting said plurality of encoded user data channels across a free space optical channel includes arbitrary combinations of ultradense wavelength division multiplexing and high-order modulation of said plurality of encoded user data channels.

6. The method of claim 1, wherein the number of diverse channels and the length of the delays are dynamically reconfigurable.

7. The method of claim 1, wherein said method is protocol independent.

8. A fade-resistant forward error correction (FEC) system for free-space optical communication, comprising:
   an FEC code encoder for encoding user input data with a FEC code to produce encoded user data;
   means for producing a plurality of encoded user data channels from said encoded user data, wherein each particular channel of said encoded user data channels comprises a unique delay relative to all of the other channels of said plurality of encoded user data channels;
   means for transmitting said plurality of encoded user data channels across a free space optical channel to produce transmitted channels;
   means for receiving said transmitted channels and separating each channel from said transmitted channels to produce a plurality of received channels;
   means for detecting each said plurality of channels;
   means for adjusting selected ones of said received channels so all of them are temporally equal;

means for decoding said received channels to produce decoded channels; and means for sending the first successfully decoded received channel of said decoded channels as a recovered user data output, wherein said means for transmitting said plurality of encoded user data channels across a free space optical channel comprises:

a first quadrature phase shift keying (QPSK) encoder for QPSK encoding a first group of at least two channels of said encoded user data channels and combining said first group in said first QPSK encoder into a first QPSK transmission channel;

a first driver for driving a first optical phase modulator (OPM) with said first QPSK transmission channel;

a first modulator for modulating a first laser beam produced by a first UDWDM laser with said first OPM to produce a first OPM channel;

a second quadrature phase shift keying (QPSK) encoder for QPSK encoding a second group of at least two channels of said encoded user data channels and combining said second group in said second QPSK encoder into a second QPSK transmission channel;

a second driver for driving a second optical phase modulator (OPM) with said second QPSK transmission channel;

a second modulator for modulating a second laser beam produced by a second UDWDM laser with said second OPM to produce a second OPM channel;

a wavelength division multiplexing multiplexor (WDM-MUX) for combining said first OPM channel and said second OPM channel to produce combined channels; and means for transmitting said combined channels across said free-space optical channel to produce said transmitted channels;

wherein said means for receiving said plurality of encoded user data channels and separating each channel from said plurality of encoded user data channels comprises:

a wavelength division multiplexing de-multiplexor to reconstruct said first OPM channel and said second OPM channel to produce a reconstructed first OPM channel and a reconstructed second OPM channel;

a first QPSK optical phase decoder for decoding said first OPM channel to produce a first group of light beams corresponding to said first group; and a second QPSK optical phase decoder for decoding said second OPM channel to produce a second group of light beams corresponding to said second group, wherein said first group of light beams and said second group of light beams are referred to as a plurality of received beams.

* * * * *